United States Patent
Höcht et al.

(10) Patent No.: US 11,428,759 B2
(45) Date of Patent: Aug. 30, 2022

(54) METHOD FOR ACQUIRING A COMMUNICATION SIGNAL OF A PERSON SITUATED WITHIN A MAGNETIC RESONANCE EXAMINATION ROOM AND A CORRESPONDING MAGNETIC RESONANCE APPARATUS

(71) Applicant: Siemens Healthcare GmbH, Erlangen (DE)

(72) Inventors: Philipp Höcht, Lauf (DE); Felix Wolf, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 491 days.

(21) Appl. No.: 16/578,912

(22) Filed: Sep. 23, 2019

(65) Prior Publication Data

US 2020/0096580 A1 Mar. 26, 2020

(30) Foreign Application Priority Data

Sep. 24, 2018 (DE) .......................... 102018216230.1

(51) Int. Cl.
| | |
|---|---|
| *G01R 33/28* | (2006.01) |
| *G01R 33/30* | (2006.01) |
| *H04R 3/00* | (2006.01) |
| *H04R 1/40* | (2006.01) |
| *H01Q 7/00* | (2006.01) |
| *H01Q 1/27* | (2006.01) |

(52) U.S. Cl.
CPC ......... *G01R 33/283* (2013.01); *G01R 33/307* (2013.01); *H04R 1/406* (2013.01); *H04R 3/005* (2013.01); *H01Q 1/273* (2013.01); *H01Q 7/00* (2013.01)

(58) Field of Classification Search
CPC .... G01R 33/283; G01R 33/307; H04R 1/406; H04R 3/005; H04R 1/028; H04R 1/04; H04R 2201/401; H01Q 1/273; H01Q 7/00
See application file for complete search history.

(56) References Cited

U.S. PATENT DOCUMENTS

| | | |
|---|---|---|
| 5,033,082 A | 7/1991 | Eriksson et al. |
| 2003/0071624 A1 | 4/2003 | Schwarz |
| 2018/0133518 A1 | 5/2018 | Harper et al. |
| 2020/0301651 A1* | 9/2020 | Georganti ................ H04R 3/00 |

FOREIGN PATENT DOCUMENTS

| | | | |
|---|---|---|---|
| DE | 69032637 T2 | 5/1999 | |
| DE | 10151033 A1 | 5/2003 | |
| WO | WO-2010055283 A1 * | 5/2010 | ........... G01R 33/283 |

OTHER PUBLICATIONS

Wikipedia: "Beamforming", (https://de.wikipedia.org/wiki/Beamforming), Stand 27. Mai 2017.

* cited by examiner

*Primary Examiner* — Susan S Lee
(74) *Attorney, Agent, or Firm* — Banner & Witcoff Ltd.

(57) ABSTRACT

A method and magnetic resonance apparatus for acquiring a communication signal of a person situated within a magnetic resonance examination room. The method includes acquiring an item of position information of the person using an acquirer, adjusting at least one microphone of a microphone array on the basis of the acquired position information, and acquiring communication signals of the person using the microphone array.

17 Claims, 1 Drawing Sheet

METHOD FOR ACQUIRING A COMMUNICATION SIGNAL OF A PERSON SITUATED WITHIN A MAGNETIC RESONANCE EXAMINATION ROOM AND A CORRESPONDING MAGNETIC RESONANCE APPARATUS

TECHNICAL FIELD

The present invention relates to a method for acquiring a communication signal of a person situated within a magnetic resonance examination room. The present invention also relates to a magnetic resonance apparatus with a scanner unit, a control unit and a communication unit with a microphone array having two or more microphones, wherein the magnetic resonance apparatus is configured for carrying out the inventive method for acquiring a communication signal of a person situated within a magnetic resonance examination room. The present invention further relates to a computer program product with a program that is configured for carrying out the method for acquiring a communication signal of a person situated within a magnetic resonance examination room and also an electronically readable data carrier with the computer program product.

BACKGROUND

Magnetic resonance examinations are often very loud. One reason for this is very rapidly changing gradient fields, which interact with a static magnetic field and thereby generate vibrations in the audible range. Due to this high noise level during a magnetic resonance examination, for example, a communication between a patient and an operator, for example, an operating medical personnel member supervising the magnetic resonance examination, is made more difficult. In particular, the sounds of the patient are difficult to distinguish from an ambient noise during a speech detection and/or speech transmission. However, this can lead to errors in the speech detection and/or the speech transmission.

For example, in this way, misunderstandings can occur during the magnetic resonance examination between the patient and the operating medical personnel, which could accelerate a feeling of discomfort in the patient during the magnetic resonance examination and/or can lead to an undesirable interruption of the scan.

SUMMARY

It is an object, in particular, of the present invention to provide a more reliable speech acquisition during a medical imaging investigation. The object is achieved with the features of the independent claims. Advantageous embodiments are disclosed in the subclaims.

The invention proceeds from a method for acquiring a communication signal of a person situated within a magnetic resonance examination room, comprising the following steps: acquiring an item of position information of the person by means of an acquisition unit, adjusting at least one microphone of a microphone array on the basis of the acquired position information, and acquiring communication signals of the person by means of the microphone array.

A communication signal should be understood in this context, in particular, to be a speech signal. Preferably, the communication signal, in particular, the speech signal, is spoken by the person situated in the magnetic resonance examination room.

The magnetic resonance examination room comprises a room within which a scanner unit of a magnetic resonance apparatus is arranged. The scanner unit therein comprises a constant field magnet for generating a homogeneous constant magnetic field. Furthermore, the scanner unit comprises a gradient coil unit and a high frequency antenna unit. The scanner unit also has a patient receiving region which is at least partially surrounded by the high frequency antenna unit and/or the gradient coil unit and/or the constant field magnet. For example, the scanner unit can have a centrally arranged cylindrical opening which comprises the patient receiving region of the magnetic resonance apparatus. For a magnetic resonance examination, the patient is positioned within the patient receiving region. The magnetic resonance examination room is provided separately from a control room and is screened with regard to an exchange of an electromagnetic radiation.

The person situated in the magnetic resonance examination room can be, for example, a patient who remains, for a preparation for a magnetic resonance examination and/or during the magnetic resonance examination, in the magnetic resonance examination room. During the magnetic resonance examination, it is important that the patient can communicate with the operator, in particular, an operating medical personnel member, in order to notify him of a stress situation and/or an emergency situation and/or a condition. For example, in this way, the patient can notify the operating medical personnel that he is too hot or cold or that he can no longer lie still, etc. Furthermore, the person situated in the magnetic resonance examination room can also be the operating medical personnel member. By means of the acquired communication signals, in particular, by means of acquired speech signals, the operating medical personnel can herein at least partially control the magnetic resonance examination and/or the magnetic resonance apparatus.

The acquisition unit for acquiring the position information can comprise a camera. Alternatively or additionally, the acquisition unit can also comprise the microphone array for acquiring the position information. Alternatively or additionally, for acquiring the position information, the acquisition unit can also comprise a scanner unit of the magnetic resonance apparatus, wherein position information of the patient can be acquired by means of the scanner unit. Alternatively or additionally, for acquiring the position information, the acquisition unit can also comprise a registration unit and/or a computer unit of the magnetic resonance apparatus.

The position information preferably comprises a position of the head of the person situated within the magnetic resonance examination room in order to achieve an optimum adjustment of the microphones relative to a communication source and/or a speech source. Alternatively or additionally, the position information can comprise an orientation and/or a size of the person, so that by means of a computer unit and/or a control unit of the magnetic resonance apparatus, a corresponding position of the head of the person can be determined making use of the orientation and/or a size of the person.

The microphone array preferably comprises two or more individual microphones which advantageously are arranged distributed. Preferably, the individual microphones of the two or more microphones are distributed round a patient receiving region of the magnetic resonance apparatus. In particular, the individual microphones of the two or more microphones are arranged distributed on an enclosure surrounding the patient receiving region. Alternatively or additionally, the individual microphones of the two or more microphones can also be arranged within a head high frequency antenna unit, in particular, an enclosure surrounding the head. Preferably, the individual microphones of the two or more microphones can each comprise a directional microphone. A directional microphone preferably detects sound which arrives at the directional microphone from a particular and/or defined direction. In this way, a directional microphone has a directional characteristic. By contrast, sound from other directions is more strongly damped during the conversion and/or transmission of sound into electrical signals.

Herein, the adjustment of at least one microphone of the microphone array can include a selection of a particular microphone for the acquisition of communication signals of the person, wherein preferably the selected and/or determined microphone has, for example, a shortest spacing from the communication signal source, such as for example, from the head of the patient or the head of the operating medical personnel member. For this purpose, preferably the microphone array has more than one microphone, in particular, two or more microphones. In the simplest case, from the plurality of microphones of the microphone array, the best microphone, in particular, the microphone with the greatest signal strength of a received communication signal, can be selected and the other microphones can be switched off. The adjustment of the at least one microphone of the microphone array or all the microphones of the microphone array can also include, in particular, a beam-forming, wherein the signals of all the microphones are offset against one another so that a location-dependent sensitivity can be generated. This can advantageously be used to raise the useful sound level relative to the interfering sound level. Such a procedure acts like a mechanical adjustment of an individual microphone, but involves a purely mathematical relationship in which the at least two microphones of the microphone array are involved.

Alternatively or additionally, the adjustment of the at least one microphone of the microphone array can also involve a determination and/or a selection of a sound direction for at least one of the microphones of the microphone array, wherein the sound direction has a direction from the sound source, in particular, from the patient or from the operating medical personnel to the at least one microphone. Particularly advantageously, the adjustment can also comprise a determination and/or a selection of a sound direction for all the microphones of the microphone array.

By means of the inventive design of the method, a reliable speech acquisition can advantageously be provided during a magnetic resonance examination. In particular, with the inventive method, noise sources which would interfere with a communication with a person situated within the magnetic resonance examination room, can be reduced and/or eliminated, in particular, blocked out during the acquisition of communication signals. On the basis of a reduction and/or elimination, in particular, blocking out, of the interfering sounds, during the acquisition and/or transmission of the communication signals, an advantageous signal to noise ratio (SNR), in particular, a useful signal to interfering signal ratio can exist at which the noise signals, in particular, the interfering signals are reduced. Associated therewith, a better comprehensibility of the acquired and transmitted speech signals of the person situated within the magnetic resonance examination room can also be achieved. Such interfering noise sources typically include the scanner unit of the magnetic resonance apparatus since here very rapidly changing gradient fields, which interact with the static magnetic field can generate vibrations in the audible range.

In an advantageous development of the inventive method, it can be provided that the acquisition of communication signals by means of the microphone array takes place during a magnetic resonance examination on a patient. By this means, in particular, a substantially interference-free communication can be achieved within a noisy environment, in particular, during a magnetic resonance examination.

During a magnetic resonance examination, a communication preferably takes place between the patient who is arranged within a patient receiving region of the scanner unit, and an operator, in particular, an operating medical personnel member. The patient is thus situated within the magnetic resonance examination room. However an operator, in particular, an operating medical personnel member, is usually situated in a control room for monitoring the magnetic resonance examination. In order to maintain a communication between the operating medical personnel member and the patient, the magnetic resonance apparatus has a communication unit with a microphone array. By means of the communication unit, the patient can communicate his condition to the operating medical personnel during the magnetic resonance examination, and also the operating medical personnel can give the patient instructions or have a calming effect on the patient. By means of the inventive method, communication signals, in particular, speech signals can be transmitted substantially interference-free and also the loud ambient sounds from the magnetic resonance examination can be blocked out and/or suppressed. Thus a false interpretation of the transmitted communication signals can advantageously be prevented. This can lead to a time-saving running time for a magnetic resonance examination. In addition, the operator can also respond to the condition of the patient during the magnetic resonance examination, for example, have a calming effect on the patient, so that by this means undesirable scan interruptions caused by the patient can advantageously also be prevented.

Alternatively or additionally, the acquisition of communication signals by means of the microphone array can also take place during a service, wherein the communication signals of a service technician can be acquired during an operation of the magnetic resonance apparatus.

In an advantageous development of the inventive method, it can be provided that the person situated within the magnetic resonance examination room includes a patient and the acquisition of the position information includes an acquisition of a position of an accessory unit. For example, the accessory unit comprises a local high frequency antenna unit which is arranged round the region of the patient to be examined during the magnetic resonance examination in order to acquire magnetic resonance signals. For local high frequency antenna units, in particular, the position of which is firmly defined independently of a patient size, a particularly easy acquisition of the position information, in particular, an item of position information regarding a position of the head of the patient can be obtained. The acquisition unit can include the accessory unit, in particular, the local high frequency antenna unit.

An example of such a high frequency antenna unit is a head high frequency antenna unit, the position of which is firmly defined by a plug-in position on the patient positioning device. In addition, when a foot high frequency antenna unit is used, a position of the patient on the patient positioning device can be concluded and thus also information relating to a position of the head of the patient can be obtained. For example, when a foot high frequency antenna unit is used, the patient is arranged in a feet-first position on the patient positioning device and is moved with the feet in front into the patient receiving region of the magnetic resonance apparatus. Thus together with an item of information regarding a size of the patient, a position of the head of the patient can be determined by means of the computer unit. By means of this embodiment of the invention, a determination of the position of the head of the patient can take place particularly rapidly since existing information and/or data of the patient and/or the impending magnetic resonance examination can be drawn upon.

In an advantageous development of the inventive method, it can be provided that the person situated within the magnetic resonance examination room includes a patient and the acquisition of the position information takes place on the basis of patient information of a patient registration. By means of the patient registration, the patient is preferably registered for the impending magnetic resonance examination and thereby, examination-relevant information of the patient, such as a size of the patient and/or an examination type and/or a position of the patient is acquired. The acquisition unit can comprise a computer unit and/or a registration unit.

The position of the patient comprises, in particular, a position of the patient which he assumes on the patient positioning device for the impending magnetic resonance examination, for example, a feet-first position in which the patient is moved with the feet in front into the patient receiving region of the magnetic resonance apparatus or a head-first position in which the patient is moved with the head in front into the patient receiving region of the magnetic resonance apparatus. The examination type can, for example, comprise a region of the patient to be investigated, so that on the basis of the patient position on the patient positioning device and/or the size of the patient, a position of the head of the patient can be determined. This embodiment of the invention enables a determination of the position of the head of the patient can take place particularly rapidly since existing information and/or data of the patient and/or the impending magnetic resonance examination can be drawn upon.

In an advantageous development of the inventive method, it can be provided that the person situated within the magnetic resonance examination room includes a patient and the acquisition of the position information takes place by means of a body model. In the body model, further position information and/or patient-related information can be included, such as for example a size of the patient and/or a position of the patient on the patient positioning device and/or an investigation type on the patient. Thus on the basis of the body model, a position of the head of the patient can be rapidly determined with great accuracy. Preferably, the body model is included in a computer unit, wherein the computer unit can be arranged within the magnetic resonance apparatus. For this purpose, the computer unit has a requisite software item and/or computer programs, in particular, a calculation algorithm for a computer model in order, on the basis of the available position information and/or on the basis of the patient-related information, to determine a position of the head of the patient. The acquisition unit can thereby include the computer unit together with the body model.

In an advantageous development of the inventive method, it can be provided that the person situated within the magnetic resonance examination room includes a patient and the acquisition of the position information takes place by means of a magnetic resonance scan. The acquisition unit can thereby comprise a scanner unit of the magnetic resonance apparatus. Preferably, the magnetic resonance scan comprises a localizer scan and/or a scout scan that is performed before the medical magnetic resonance examination on the patient. The localizer scan and/or the scout scan preferably involves an image resolution that is lower than an image resolution of the subsequent medical magnetic resonance examination. Depending upon the impending examination type of the magnetic resonance examination, by means of the localizer scan and/or the scout scan, image data of the whole patient can be acquired or image data can be acquired from just a subregion of the patient. In addition, the localizer scan and/or the scout scan can be carried out specifically for the acquisition of the position information. Particularly advantageously, however, for the acquisition of the position information of a patient, the image data of the already necessary localizer scan and/or the scout scan can be made available for the impending magnetic resonance examination. This embodiment of the invention also enables a determination of the position of the head of the patient particularly rapidly since existing information and/or data of the patient and/or the impending magnetic resonance examination can already be drawn upon.

In an advantageous development of the inventive method, it can be provided that the acquisition of the position information takes place by means of a camera. The acquisition unit can thereby comprise the camera. By means of a camera, both an item of position information of the patient and also an item of position information of an operator, in particular, an operating medical personnel member, can be acquired and provided for the acquisition of the position information. In particular, hereby position information of persons situated and/or remaining outside an acquisition region of the magnetic resonance apparatus can be acquired. The camera can thereby comprise a 2D camera or preferably a 3D camera. Alternatively, the camera can also comprise an acoustic camera and/or a further camera deemed useful by a person skilled in the art. Alternatively or in addition to the camera, the acquisition of the position information can take place by means of further sensors, for example, an ultrasonic sensor and/or a radar sensor and/or a LIDAR sensor.

In an advantageous development of the inventive method, it can be provided that the acquisition of the position information takes place by means of the microphone array, whereby the position information is determined dependent upon a signal strength of an acquired communication signal of the individual microphones of the microphone array. The acquisition unit can thereby comprise the microphone array. By means of the microphone array, in particular, by means of the individual microphones of the microphone array, both an item of position information of the patient and also an item of position information of an operator, in particular, an operating medical personnel member, can be acquired and/or provided for the acquisition of the position information. In particular, hereby position information of persons situated and/or remaining outside an acquisition region of the magnetic resonance apparatus can be acquired.

Preferably, hereby by means of a computer unit, a signal strength of the individual microphones is evaluated for acquiring the position information. In addition, a signal direction of the individual microphones can also be evaluated for determining the position information. On the basis of the signal strengths of the individual microphones or the signal strength together with the signal direction of the individual microphones, an item of position information of a communication source, in particular the patient or the operating medical personnel can be determined by the computer unit. Hereby, it can be useful if the acquisition of the position information takes place by means of the microphone array before the medical magnetic resonance examination, so that interference sources that cause loud sounds do not yet occur and thus a simple attribution of a communication source can take place. Hereby, the individual microphones can also be oriented to a possible communication source in order to enable a precise localization and/or positioning of a communication source. Alternatively, by means of beam forming, wherein preferably all the microphones of the microphone array are used, a region is also searched in order to find a maximum, wherein the maximum of a communication source can be attributed, for example, to the patient or the operating medical personnel. This searching of a region with the microphone array can also be designated an acoustic camera.

Preferably, in order to acquire a communication signal by means of the microphones, the acquired signals must be stronger than a specified threshold value so that on an evaluation by the computer unit, a communication signal can be attributed within the computation unit to the acquired signals. The stronger the acquired signals are, in particular the greater the amplitude of the acquired signals is, the closer to the communication source the adjustment of the microphones is situated. The determination of the position information by means of individual microphones of the microphone array can thereby be controlled automatically and/or independently by means of the computer unit. For this purpose, the computer unit has a requisite software item and/or computer programs, in particular, a calculation algorithm in order, on the basis of the acquired communication signals, to determine an item of position information of a position of the head.

In an advantageous development of the inventive method, it can be provided that after the acquisition of the position information and after the adjustment of the at least one microphone of the microphone array on the basis of the acquired position signals, a movement of a patient table takes place and an adjustment of the at least one microphone is tracked dependent upon the position change of the patient table and/or dependent upon a movement speed of the patient table. If the region to be examined of the patient is larger than an acquisition region and/or the field of view of the magnetic resonance apparatus, for the acquisition of the entire region to be examined of the patient, the region to be examined must be subdivided into two or more individual examination subregions. For the acquisition of image data of the individual examination subregions, the patient must therefore be displaced and/or moved by means of the patient table within the patient receiving region of the magnetic resonance apparatus. In the case of microphones which are adjusted to the communication source, in particular the head of the patient, only at the start of the magnetic resonance examination, the patient, in particular, the head of the patient is situated, on a movement of the patient table, outside the acquisition region of the microphones.

By means of the tracking of the adjustment of the at least one microphone of the microphone array, the at least one microphone can advantageously always remain focused on the communication source and/or the speech source. Particularly advantageously, the change of the adjustment takes place adapted to the position change of the patient table and/or dependent upon a movement speed of the patient table. This enables a constant quality of the acquired communication signals during the magnetic resonance examination. Thus, a communication between the patient and an operating medical personnel member can be maintained during the magnetic resonance examination with constant quality.

In an advantageous development of the inventive method, it can be provided that a communication between a patient and an operating medical personnel member takes place on the basis of the acquired communication signals. Typically, the communication takes place between the patient who is situated within the magnetic resonance examination room and the operating medical personnel situated, during the magnetic resonance examination on the patient, within the control room to monitor the magnetic resonance examination. During the communication, the operating medical personnel can give instructions to the patient, for example, breathing instructions for individual scan steps, or can have a calming effect on the patient. In addition, the patient can also communicate his current condition to the operating medical personnel. By means of this embodiment of the invention, a communication between the patient and the operating medical personnel during the magnetic resonance examination, in which only few interfering sounds are also transmitted, can advantageously be improved. In particular, in this way, messages from the patient can be transmitted correctly, in particular, free from interference, to the operator, in particular, the operating medical personnel. In addition the magnetic resonance examination can thereby be carried out efficiently and in a time-saving manner and undesirable scan interruptions can also advantageously be reduced and/or prevented.

In an advantageous development of the inventive method, it can be provided that, on the basis of the acquired communication signals, a communication takes place between an operator and a control unit for a control of a magnetic resonance apparatus. Preferably hereby, the operator, in particular the operating medical personnel is situated, for control of the magnetic resonance apparatus, within the magnetic resonance examination room. By this means, a reliable speech control of the magnetic resonance apparatus can advantageously take place during the magnetic resonance examination.

The invention also relates to a magnetic resonance apparatus having a scanner unit, a control unit and a communication unit with a microphone array comprising two or more microphones, wherein the control unit is configured together with the communication unit for carrying out a method for acquiring a communication signal of a person situated within a magnetic resonance examination room.

By means of the inventive design of the magnetic resonance apparatus, a reliable speech acquisition can advantageously be provided during a magnetic resonance examination. In particular, noise sources which would interfere with a communication with a person situated within the magnetic resonance examination room, can be reduced and/or eliminated, in particular, blocked out during the acquisition of communication signals. On the basis of a reduction and/or elimination, in particular, blocking out, of the interfering sounds, during the acquisition and/or transmission of the communication signals, an advantageous signal to noise ratio (SNR) exists at which the noise signals are reduced. Associated therewith, a better comprehensibility of the acquired and transmitted speech signals of the person situated within the magnetic resonance examination room can also be achieved.

The advantages of the inventive magnetic resonance apparatus correspond substantially to the advantages of the inventive method for acquiring a communication signal of a person situated within a magnetic resonance examination room that have already been set out in detail. Features, advantages or alternative embodiments mentioned herein can also be transferred to the other claimed subject matter and vice versa.

In an advantageous development of the inventive magnetic resonance apparatus, it can be provided that the scanner unit comprises a patient receiving region, wherein at least one of the two or more microphones of the microphone array is arranged within the patient receiving region. Preferably, at least two or more of the microphones of the microphone array are arranged within the patient receiving region. By this means, an advantageous arrangement of the individual microphones round the patient can be achieved for a communication signal acquisition, in particular a speech signal acquisition, of a communication signal, in particular, a speech signal of a patient during the magnetic resonance examination. Preferably, the individual microphones arranged within the patient receiving region are arranged distributed within the patient receiving region such that regardless of a position of the patient within the patient receiving region, an advantageous proximity of at least one of the microphones to the patient, in particular the head of the patient, is always achieved.

Alternatively or additionally, the microphone array or at least one or two or more microphones of the microphone array can be arranged in a head high frequency antenna unit. Herein also, an advantageous patient proximity can be achieved for the arrangement of the individual microphones.

In an advantageous development of the inventive magnetic resonance apparatus, it can be provided that at least one of the two or more microphones of the microphone array comprises a directional microphone. This has the advantage that a simple adjustment of the individual microphones to a communication source, in particular a speech source, for example, the head of a patient can be achieved. Preferably, all the microphones of the microphone array have a directional microphone.

In an advantageous development of the inventive magnetic resonance apparatus, it can be provided that at least one of the two or more microphones of the microphone array is arranged outside the patient receiving region. For example, hereby the at least one of the two or more microphones can be arranged on a front side of the scanner unit or on the patient positioning device, for example, on a region of the patient table projecting at the front side of the patient receiving region. By this means, a simple and interference-free acquisition of communication signals can also be provided outside the patient receiving region. In particular, hereby a proximity of the at least one microphone to a communication source and/or a speech source outside the patient receiving region can be achieved. For example, in this way, communication signals of a patient who is arranged in a feet-first position on the patient table and therefore the head of the patient is arranged and/or positioned outside the patient receiving region during the magnetic resonance examination, can be clearly acquired. Furthermore, communication signals of an operator who is situated within the magnetic resonance examination room can thereby be clearly received.

In an advantageous development of the inventive magnetic resonance apparatus, it can be provided that the magnetic resonance apparatus comprises a camera for acquiring an item of position information. The camera can comprise, for example, a 2D camera or a 3D camera. This embodiment of the invention has the advantage that an acquisition of an item of position information can also be easily achieved for persons who are not patients and who are situated within the magnetic resonance examination room, for example, operating medical personnel.

The invention further relates to a computer program product which comprises a program and is directly loadable into a memory store of a programmable control unit, having program means in order to carry out a method for acquiring a communication signal of a person situated within a magnetic resonance examination room when the program is executed in the control unit. Thereby, the computer program product possibly requires program means, e.g. libraries and auxiliary functions in order to realize the corresponding embodiments of the method. The computer program can thereby comprise an item of software with a source code which must still be compiled and linked or which must only be interpreted, or an executable software code which, for execution, must only be loaded into a corresponding computer unit.

In addition, it can be that an execution of the inventive method takes place by means of hardware, for example, an FPGA (Field Programmable Gate Array), that is, an integrated circuit of digital technology, or an ASIC (Application-Specific Integrated Circuit), that is, an electronic circuit that has been realized as an integrated circuit, etc.

The inventive computer program product is directly loadable into a memory store of a programmable computer unit and has program code means in order to carry out an inventive method when the computer program product is executed in the computer unit. The computer program product can be a computer program or can comprise a computer program. In this way, the inventive method can be carried out rapidly, exactly reproducibly and robustly. The computer program product is configured such that it can carry out the inventive method steps by means of the computer unit. The computer unit must have the respective pre-conditions such as, for example, a suitable working memory store, a suitable graphics card or a suitable logic unit so that the respective method steps can be carried out efficiently. The computer program product is stored, for example, on a computer-readable medium or is deposited on a network or server from where it can be loaded into the processor of a local computer unit which can be directly connected to, or configured as part of, the magnetic resonance apparatus. Furthermore, control information of the computer program product can be stored on an electronically readable data carrier. The items of control information of the electronically readable data carrier can be configured such that they carry out an inventive method when the data carrier is used in a computer unit. Thus, the computer program product can also constitute the electronically readable data carrier. Examples of electronically readable data carriers are a DVD, a magnetic tape, a hard disk drive or a USB stick, on which electronically readable control information, in particular software (see above) is stored. If this control information (software) is read from the data carrier and stored in a control system and/or a computer unit, all the embodiments according to the invention of the above-described methods can be carried out. The invention can therefore also proceed from the aforementioned computer-readable medium and/or the aforementioned electronically readable data carrier.

The invention further relates to a computer-readable data carrier which includes a program which is provided for carrying out a method for acquiring a communication signal of a person situated within a magnetic resonance examination room.

Further advantages, features and details of the invention are disclosed in the exemplary embodiment described below by reference to the drawings.

DETAILED DESCRIPTION

Figure 1:
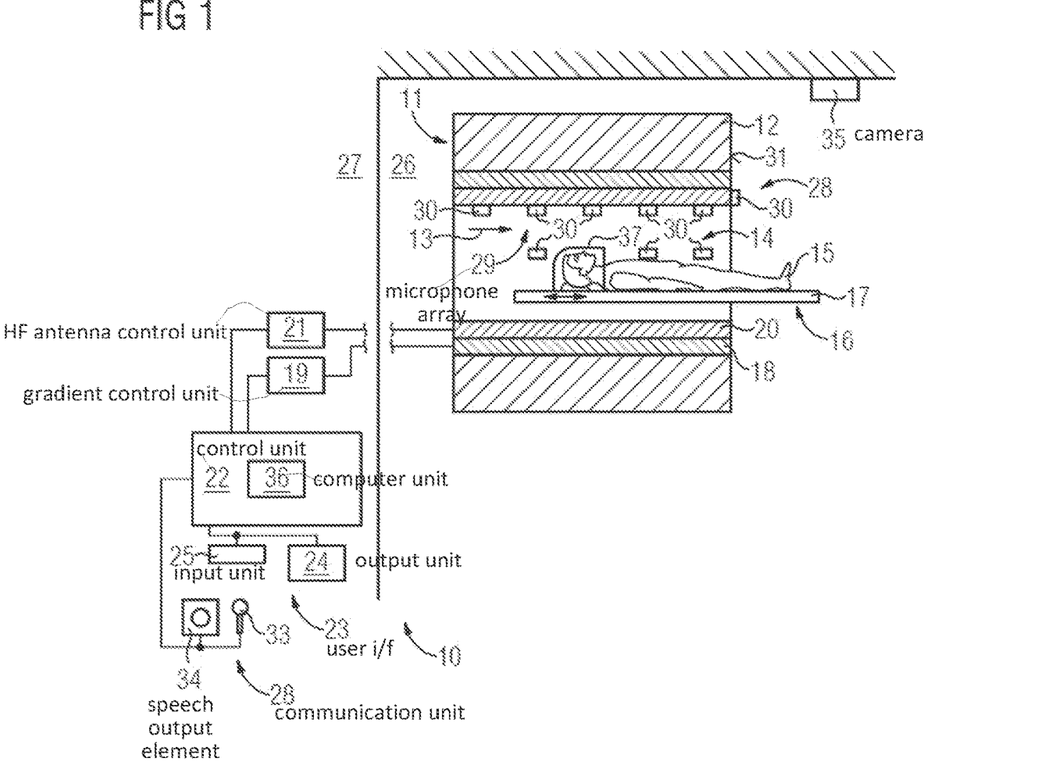
FIG. 1 is a schematic representation of an inventive magnetic resonance apparatus.

FIG. 1 shows schematically an inventive magnetic resonance apparatus 10. The magnetic resonance apparatus 10 comprises a scanner unit 11 formed by a magnet unit which comprises a superconducting constant field magnet 12 for generating a strong and, particularly, a constant magnetic field 13. Furthermore, the magnetic resonance apparatus 10 comprises a patient receiving region 14 for receiving a patient 15. In the present exemplary embodiment, the patient receiving region 14 is configured cylindrical and is surrounded cylindrically in a peripheral direction by the magnet unit 11. In principle, however, a configuration of the patient receiving region 14 deviating therefrom is readily conceivable. The patient 15 can be pushed and/or moved by means of a patient positioning device 16 of the magnetic resonance apparatus 10 into the patient receiving region 14. For this purpose, the patient positioning device 16 has a patient table 17 which is configured to be movable within the patient receiving region 14.

The scanner unit 11, in particular, the magnet unit also has a gradient coil unit 18 for generating magnetic field gradients that are used for position encoding during an imaging process. The gradient coil unit 18 is controlled by means of a gradient control unit 19 of the magnetic resonance apparatus 10. The scanner unit 11, in particular, the magnet unit further comprises a high frequency antenna unit 20 for exciting a polarization which forms in the constant magnetic field 13 generated by the constant field magnet 12. The high frequency antenna unit 20 is controlled by a high frequency antenna control unit 21 of the magnetic resonance apparatus 10 and radiates high frequency magnetic resonance signals into the patient receiving region 14 of the magnetic resonance apparatus 10.

For controlling the constant field magnet 12, the gradient control unit 19 and, for controlling the high frequency antenna control unit 21, the magnetic resonance apparatus 10 has a control unit 22. The control unit 22 centrally controls the magnetic resonance apparatus 10, by way of example, the execution of a pre-determined imaging gradient echo sequence. Furthermore, the control unit 22 comprises an evaluation unit (not disclosed in detail) for evaluating medical image data which is acquired during the magnetic resonance examination.

Furthermore, the magnetic resonance apparatus 10 comprises a user interface 23 which is connected to the control unit 22. Control information such as, for example, imaging parameters and reconstructed magnetic resonance images can be displayed on an output unit 24, for example, on at least one monitor of the user interface 23 for operating medical personnel. In addition, the user interface 23 has an input unit 25 by means of which the information and/or parameters can be input by the operating medical personnel during a scanning procedure.

The scanner unit 11 is arranged together with the patient positioning device 16 in a magnetic resonance examination room 26. By contrast, the control unit 22 is arranged together with the user interface 23 within a control room 27. The control room 27 and the magnetic resonance examination room 26 are provided separately from one another. In addition, the control room 27 and the magnetic resonance examination room 26 are designed decoupled from one another with regard to an exchange of electromagnetic radiation.

Furthermore, the magnetic resonance apparatus 10 comprises a communication unit 28 with a microphone array 29. The microphone array 29 has two or more microphones 30. At least one of the microphones 30 of the microphone array 29 can comprise a directional microphone. Preferably, all of the two or more microphones 30 of the microphone array 29 each comprise a directional microphone. The microphone array 29 with the two or more microphones 30 is arranged within the magnetic resonance examination room 26 and is configured for an acquisition of communication signals of a person situated within the magnetic resonance examination room 26. For this, a first of the two or more microphones 30 of the microphone array 29 is arranged on a front side 31 of the scanner unit 11. The remainder of the two or more microphones 30 of the microphone array 29 are arranged within the patient receiving region 14. In particular, the remainder of the two or more microphones 30 of the microphone array 29 are arranged distributed within the patient receiving region 14. The individual microphones 30 of the microphone array 29 are each arranged and/or integrated on an enclosure of the scanner unit 11 surrounding the patient receiving region 14. In the present exemplary embodiment, eight microphones 30 of the microphone array 29 are arranged within the patient receiving region 14, whereby the invention is not restricted to eight microphones 30 of the microphone array 29 within the patient receiving region 14.

In addition, it can also be provided in an alternative embodiment of the invention that at least one of the microphones 30 of the microphone array 29 is integrated within the patient table 17 of the patient positioning device 16. Thereby, the at least one microphone 30 can advantageously be integrated into a positioning surface of the patient table 17. Furthermore, in an alternative embodiment of the invention, at least one of the microphones 30 of the microphone array 29 can also be arranged within a patient headphone (not shown in detail) or within the local high frequency antenna unit 37, in particular, a local head high frequency antenna unit 37.

The microphone array 29 is thus arranged within the magnetic resonance examination room 26. By means of the microphones 30 of the microphone array 29 arranged within the patient receiving region 14, an acquisition of communication signals and/or speech signals of a patient 15 can take place. By means of the microphone 30 of the microphone array 29 arranged on the front side 31 of the scanner unit 11, an acquisition of communication signals and/or speech signals of persons who are situated and/or remain outside the patient receiving region 14 or whose head is arranged outside the patient receiving region 14 can take place. Alternatively or additionally, it is also conceivable that at least one of the microphones 30 of the microphone array 29 within the patient receiving region 14 can be directed outwardly.

The communication unit 28 further comprises a headphone 32 which the patient 15 wears during a magnetic resonance examination for a communication during the magnetic resonance examination. Furthermore, the communication unit 28 comprises a further microphone 33 and a speech output element 34, for example, a loudspeaker, within the control room 27 so that during a magnetic resonance examination, a communication between the patient 15 who is arranged within the patient receiving region 14 and the operating medical personnel who are situated within the control room 27 for monitoring the magnetic resonance examination, can take place.

In the present exemplary embodiment, the magnetic resonance apparatus 10 further comprises a camera 35 which is arranged within the magnetic resonance examination room 26. The camera 35 can comprise, for example, a 2D camera or a 3D camera. In the present embodiment, the camera 35 is arranged on a room ceiling of the magnetic resonance examination room 26. In an alternative embodiment of the invention, the camera 35 can also be arranged on the front side 31 of the scanner unit 11 or on a wall of the magnetic resonance examination room 26. Furthermore, the magnetic resonance apparatus 10 can also comprise more than one camera 35.

The magnetic resonance apparatus 10 described can naturally comprise further components that magnetic resonance apparatuses 10 typically have. A general mode of operation of a magnetic resonance apparatus 10 is also known to a person skilled in the art, so that a detailed description of the further components is not included.

Figure 2:
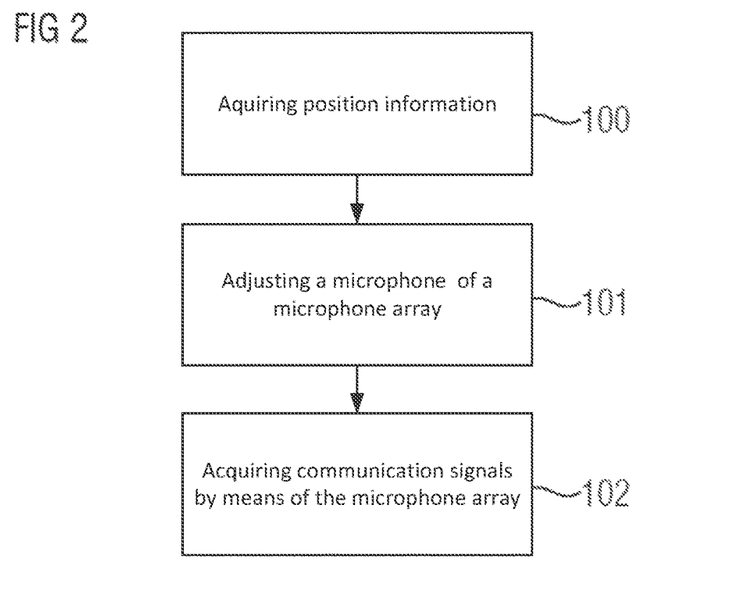
FIG. 2 is an inventive method for acquiring a communication signal of a person situated within a magnetic resonance examination room.

FIG. 2 illustrates an inventive method for acquiring a communication signal of a person situated within the magnetic resonance examination room 26, in particular the patient 15 and/or the operating medical personnel. In one embodiment of the inventive method, the magnetic resonance apparatus 10 comprises a computer unit 36. In the present exemplary embodiment, the computer unit 26 is integrated within the control unit 22. In principle, the computer unit 36 can also be configured separately from the control unit 22. Herein, the computer unit 36 can be arranged within the magnetic resonance apparatus 10 or can comprise an external computer unit 36.

For the performance of the inventive method for acquiring a communication signal of a person situated within the magnetic resonance examination room 26, the computer unit 36 comprises a requisite software and/or computer programs. The software and/or computer programs are configured for control of the inventive method when the software and/or computer programs are carried out in a processor (not disclosed in detail) of the computer unit 36. In addition, the software and/or computer programs are also configured for carrying out the individual method steps or substeps of the inventive method when the software and/or computer programs are carried out in the processor of the computer unit 36. The software and/or computer programs are stored in a memory store (not disclosed in detail) of the computer unit 36. Alternatively or additionally, the software and/or computer programs can also be stored in a memory store arranged outside the computer unit 36. The memory store can be included by the control unit 22 and/or the magnetic resonance apparatus 10 or by an external memory store, wherein the computer unit 36 can access the memory store by means of a data network (not disclosed in detail).

At a start of the inventive method, the patient 15 is already positioned on the patient positioning device 16, in particular on the patient table 17 of the patient positioning device 16 and is prepared for the magnetic resonance apparatus. Herein, all the accessory units required for the magnetic resonance examination, for example, a local high frequency antenna unit 37 and/or an ECG unit and/or an infusion unit, etc., are arranged on the patient 15. In addition, the patient 15 is already situated in an examination position within the patient receiving region 14.

In a first method step, firstly an acquisition of an item of position information of the person remaining and/or situated within the magnetic resonance examination room 26 takes place. The acquisition of the position information takes place by means of an acquisition unit of the magnetic resonance apparatus 10.

If the person situated within the magnetic resonance examination room 26 is the patient 15, the position information can comprise, for example, an acquisition of a position of an accessory unit. The accessory unit preferably comprises the local high frequency antenna unit 37 which is arranged round the region of the patient 15 to be examined to acquire magnetic resonance signals. The acquisition of the position of the accessory unit can take place by means of the computer unit 36. Herein, the acquisition unit includes the computer unit 36. Thereby, the individual plug-in contacts (not disclosed in detail) which are arranged on the patient positioning device 16 and by means of which, in particular, the local high frequency antenna units 37 are connected to the magnetic resonance apparatus 10, can be read by the computer unit 36, so that the information is present at the computer unit 36 as to which local high frequency antenna unit 37 is plugged into which plug contact. If, for example, a head high frequency antenna unit is plugged into a plug-in contact, the head high frequency antenna unit always has the same position relative to the patient positioning device 16, in particular, relative to the patient table 17, so that a position of the head of the patient 15 is predetermined due to a predetermined position of the head high frequency antenna unit. In addition, when a foot high frequency antenna unit is used, a position of the patient 15, in particular a feet first position in which the patient 15 is moved with the feet in front into the patient receiving region 14 of the magnetic resonance apparatus 10, can be concluded by the computer unit 36 and thus also an item of information relating to a position of the head of the patient 15 can be obtained.

If the person situated within the magnetic resonance examination room is the patient 15, the position information can also comprise, for example, on the basis of patient information, a patient registration for the magnetic resonance examination. The acquisition of patient information of a patient registration can take place by means of the computer unit 36. Herein, the acquisition unit includes the computer unit 36. By means of the patient registration, the patient 15 is preferably registered for the impending magnetic resonance examination and thereby, a size of the patient 15 and/or an examination type and/or a position of the patient 15 is acquired for the impending magnetic resonance examination. The position of the patient 15 comprises, in particular, a feet-first position in which the patient 15 is moved with the feet in front into the patient receiving region 14 of the magnetic resonance apparatus 10, or a head-first position in which the patient 15 is moved with the head in front into the patient receiving region 14 of the magnetic resonance apparatus 10. The examination type can, for example, include a region of the patient 15 to be examined, so that on the basis of the patient position on the patient positioning device 16, in particular on the patient table 17, and/or the size of the patient 15, a position of the head of the patient 16 can be determined.

If the person situated within the magnetic resonance examination room 26 is the patient 15, the position information can, for example, also be determined and/or calculated on the basis of a body model. The determination and/or calculation of the position information of the patient 15 by means of the body model can take place by means of the computer unit 36. Herein, the acquisition unit includes the computer unit 36. In particular, in this way, using the computer unit 36, on the basis of further position information, for example, a size of the patient 15 and/or a position of the patient 15 on the patient positioning device 16, in particular, on the patient table 17, and/or an examination type on the patient 15, a position of the head of the patient 15 can be determined rapidly and with high accuracy. For this purpose, the computer unit 36 has a requisite software item and/or computer programs, in particular, a calculation algorithm for a computer model in order, on the basis of the available position information, to determine a position of the head of the patient 15.

If the person situated within the magnetic resonance examination room 26 is the patient 15, the position information can also be acquired, for example, by means of a magnetic resonance scan. The performance of a magnetic resonance scan takes place by means of the scanner unit 11. Herein, the acquisition unit includes the scanner unit 11. Preferably, the magnetic resonance scan comprises a localizer scan and/or a scout scan that is performed before the medical magnetic resonance examination on the patient 15. The localizer scan and/or the scout scan has an image resolution that is lower than an image resolution of the subsequent medical magnetic resonance examination. Depending upon the impending examination type of the magnetic resonance examination, by means of the localizer scan and/or the scout scan, image data of the whole patient 15 can be acquired or image data can be acquired from just a subregion of the patient 15. In addition, the localizer scan and/or the scout scan can be carried out specifically for the acquisition of the position information. Particularly advantageously, however, the image data of the already necessary localizer scan and/or the scout scan can be made available for the impending magnetic resonance examination. The acquired data of the scout scan and/or the localizer scan is subsequently transferred to the computer unit 36 and is evaluated there with regard to an item of position information of the patient 15, in particular the head of the patient 15.

Furthermore, the acquisition unit can also comprise the camera 35. Thereby, by means of the camera 35, position information of persons situated outside an acquisition region, in particular the field of view, of the magnetic resonance apparatus 10 can be acquired. In particular, hereby, both an item of position information of the patient 15 and also of the operating medical personnel can be acquired.

Furthermore, the acquisition unit can also comprise the microphone array 29, so that the acquisition of the position information takes place by means of the microphone array 29. Thereby, by means of the microphone array 29, position information of persons situated outside an acquisition region, in particular the field of view, of the magnetic resonance apparatus 10 can be acquired. In particular, hereby, both an item of position information of the patient 15 and also of the operating medical personnel can be acquired.

Hereby, the position information can be determined dependent upon an acquired signal strength of an acquired communication signal by means of the individual microphones 30 of the microphone array 29. Preferably, herein by means of a computer unit 36, a signal strength of the acquired communication signal of the individual microphones 30 is evaluated and thereby an item of position information of a communication source, in particular the patient 15 or the operating medical personnel is determined. Particularly advantageously, the acquisition of the position information can take place by means of the microphone array 29 temporally before the medical magnetic resonance examination, so that interference sources that cause loud sounds do not yet occur and thus a simple attribution of a communication source can take place.

For the acquisition of the position information by means of the microphone array 29, the individual microphones 30 can be adjusted to a possible communication source in order to enable a precise localization and/or positioning of a communication source. The adjustment of the individual microphones 30 is preferably controlled by means of the computer unit 36. Herein, the acquired signals of the individual microphones 30 must be above a predetermined threshold value so that a communication signal can be attributed within the computer unit 36 to these signals. Hereby, the stronger the acquired signals are, in particular the greater the amplitude of the acquired signals is, the closer to the communication source the adjustment of the microphone 30 is situated. The determination of the position information by means of individual microphones 30 of the microphone array 29 preferably takes place automatically and/or independently by means of the computer unit 36.

The position information can be provided in this first method step 100 by means of just one information source for the position information. For example, the position information can be provided just by means of the camera 35 or just by means of the microphone array 30 or just by means of the body model or just by means of patient information of the patient registration or just by means of a position of the accessory unit. Particularly advantageously, however, in this first method step 100, the position information can be provided by means of a plurality of information sources for the position information. For example, the position information can be acquired by means of the patient registration together with the determination on the basis of a body model and/or together with the acquisition of magnetic resonance data.

Following the first method step 100, in a second method step 101, an adjustment of the at least one microphone 30 of the microphone array 29 takes place on the basis of the acquired position information. Herein, the adjustment of at least one microphone 30 of the microphone array 29 can include a selection of a particular microphone 30 for the acquisition of communication signals of the person, wherein preferably the selected and/or determined microphone 30 has, for example, a shortest spacing from the communication signal source, such as for example, from the patient 15 or the operating medical personnel or the strongest acquired communication signal. Alternatively or additionally, the adjustment of the at least one microphone 30 of the microphone array 29 can also involve a determination and/or a selection of a sound direction for at least one of the microphones 30 of the microphone array 29, wherein the sound direction has a direction from the sound source, in particular, from the patient 15 or from the operating medical personnel, to the at least one microphone 30.

Preferably, in this second method step, the adjustment of all the microphones 30 of the microphone array 29 takes place on the basis of the acquired position information, in particular, to a communication source, for example, the head of the patient 15 and/or of the operating medical personnel member. Particularly advantageously, the adjustment can also comprise a determination and/or a selection of a sound direction for all the microphones 30 of the microphone array 29. The adjustment of the at least one microphone 30 of the microphone array 29 can also include, in particular, a beam forming. In this second method step 101, the adjustment of the individual microphones 30 is controlled by means of the computer unit 36.

In a third method step 102, an acquisition of communication signals takes place by means of the microphone array 29. On the basis of the acquired communication signals, a communication can take place between the patient 15 who is arranged within the magnetic resonance examination room 26 and the operating medical personnel who are situated within the control room 27 for monitoring the magnetic resonance examination. In addition, it is also conceivable that, on the basis of the acquired communication signals, a communication takes place between the operator, in particular, the operating medical personnel, who are situated within the magnetic resonance examination room 26, and the control unit 22 for controlling the magnetic resonance apparatus 10. By this means, a communication with a maximum signal strength in the communication signals can be provided. In addition, in the communication, interfering sounds, in particular, loud knocking sounds of the scanner unit 11 during the magnetic resonance examination can be blocked out and thus a noise component in the communication signals can also be reduced.

In addition, it can also be provided in the third method step 102 that after the acquisition of the position information and after the adjustment of the at least one microphone 30 of the microphone array 29 on the basis of the acquired position information, a movement of a patient table 17 takes place and an adjustment of the at least one microphone 30 is tracked dependent upon the position change of the patient table 17 and/or dependent upon a movement speed of the patient table 17. The new adjustment of the at least one microphone 30 and/or the tracking of the at least one microphone 30 is controlled by the computer unit 36.

The inventive method can be carried out before the medical magnetic resonance examination. Particularly advantageously, however, the inventive method, in particular, the third method step 102 of the acquisition of communication signals by means of the microphone array 29 can be carried out during the magnetic resonance examination on the patient 15.

Although the invention has been illustrated and described in detail with the preferred exemplary embodiment, the invention is not restricted by the examples disclosed and other variations can be derived therefrom by a person skilled in the art without departing from the protective scope of the invention.

The invention claimed is:

1. A method for acquiring a communication signal of a person situated within a magnetic resonance examination room, comprising:
   acquiring, by a controller, an item of position information of the person using an acquirer;
   adjusting, by the controller, at least one microphone of a microphone array on the basis of the acquired position information; and
   acquiring, by the controller, communication signals of the person using the microphone array.

2. The method as claimed in claim 1, wherein the acquisition of communication signals using the microphone array takes place during a magnetic resonance examination on a patient.

3. The method as claimed in claim 1, wherein the person situated within the magnetic resonance examination room includes a patient, and the acquisition of the position information includes an acquisition of a position of an accessory.

4. The method as claimed in claim 1, wherein the person situated within the magnetic resonance examination room includes a patient, and the acquisition of the position information takes place on the basis of patient information of a patient registration.

5. The method as claimed in claim 1, wherein the person situated within the magnetic resonance examination room includes a patient, and the acquisition of the position information takes place on the basis of a body model.

6. The method as claimed in claim 1, wherein the person situated within the magnetic resonance examination room includes a patient, and the acquisition of the position information takes place on the basis of a magnetic resonance scan.

7. The method as claimed in claim 1, wherein the acquisition of the position information takes place using a camera.

8. The method as claimed in claim 1, wherein the acquisition of the position information takes place using the microphone array, and the position information is determined dependent upon a signal strength of an acquired communication signal of the individual microphones of the microphone array.

9. The method as claimed in claim 1, wherein after the acquisition of the position information and after the adjustment of the at least one microphone of the microphone array on the basis of the acquired position information, a moving a patient table and tracking an adjustment of the at least one microphone is dependent upon the position change of the patient table or dependent upon a movement speed of the patient table.

10. The method as claimed in claim 1, wherein a communication between a patient and an operating medical personnel member takes place on the basis of the acquired communication signals.

11. The method as claimed in claim 1, wherein, on the basis of the acquired communication signals, a communication takes place between an operator and the controller for a control of a magnetic resonance apparatus.

12. A non-transitory computer program product which comprises a program and is directly loadable into a memory store of a programmable controller, having program means in order to carry out a method for acquiring a communication signal of a person situated within a magnetic resonance examination room, as claimed in claim 1, when the program is executed in the controller.

13. A magnetic resonance apparatus comprising:
   a scanner;
   a controller; and
   a communicator with a microphone array comprising two or more microphones,
   wherein the controller is configured to acquire a communication signal of a person situated within a magnetic resonance examination room by:
      acquiring an item of position information of the person using an acquirer;
      adjusting at least one microphone of the microphone array on the basis of the acquired position information; and
      acquiring communication signals of the person using the microphone array.

14. The magnetic resonance apparatus as claimed in claim 13,
   wherein the scanner comprises a patient receiving region, and at least one of the two or more microphones of the microphone array is arranged within the patient receiving region.

15. The magnetic resonance apparatus as claimed in claim 13, wherein at least one of the two or more microphones of the microphone array comprises a directional microphone.

16. The magnetic resonance apparatus as claimed in claim 13, wherein at least one of the two or more microphones of the microphone array is arranged outside a patient receiving region.

17. The magnetic resonance apparatus as claimed in claim 13, wherein the magnetic resonance apparatus is a camera for acquiring an item of position information.

* * * * *